United States Patent [19]

Tocquet

[11] 4,151,437

[45] Apr. 24, 1979

[54] PIEZOELECTRIC TRANSDUCERS AND ACOUSTIC ANTENNAS WHICH CAN BE IMMERSED TO A GREAT DEPTH

[75] Inventor: Bernard Tocquet, Sanary, France

[73] Assignee: Etat Francais represente par le Delegue General Pour l'Armement, Paris, France

[21] Appl. No.: 818,960

[22] Filed: Jul. 25, 1977

[30] Foreign Application Priority Data

Aug. 3, 1976 [FR] France ............................. 76 23652

[51] Int. Cl.[2] ............................................. H01L 41/10

[52] U.S. Cl. ..................................... 310/337; 340/10; 340/9; 340/8 PC

[58] Field of Search .......... 310/337; 340/8 LF, 8 PC, 340/9, 10

[56] References Cited

U.S. PATENT DOCUMENTS

| | | | |
|---|---|---|---|
| 2,897,475 | 7/1959 | Harris | 340/8 PC |
| 3,018,466 | 1/1962 | Harris | 310/337 X |
| 3,262,093 | 7/1966 | Junger et al. | 340/8 PC |
| 3,337,843 | 8/1967 | Kendig et al. | 340/9 |
| 3,541,502 | 11/1970 | Behrendt et al. | 340/10 X |

*Primary Examiner*—Mark O. Budd

*Attorney, Agent, or Firm*—Stevens, Davis, Miller & Mosher

[57] ABSTRACT

Piezoelectric transducers and antennas comprising a plurality of identical transducers arranged coaxially, each transducer comprising a ring and a plurality of piezoelectric motor elements arranged radially against the inner wall of the ring. The rings form an envelope which is closed by two covers and the envelope encloses an axial cylindrical channel containing a piston. The inside of the envelope contains a solid material which is elastomeric or rigid and is separated from the inner walls of the envelope by a small clearance which communicates with the end of the cylinder. An application is the construction of acoustic antennas intended to be immersed to great depths.

8 Claims, 9 Drawing Figures

PIEZOELECTRIC TRANSDUCERS AND ACOUSTIC ANTENNAS WHICH CAN BE IMMERSED TO A GREAT DEPTH

BACKGROUND OF THE INVENTION

The present invention relates to piezoelectric transducers and in particular to acoustic antennas which can be immersed to a great depth. The specific field of the invention is the construction of transmitting and receiving transducers and antennas employed in underwater acoustics.

The construction of piezoelectric transducers and acoustic antennas which are to be immersed to a great depth raises problems as to the mechanical strength of the air-tight housings and coverings containing the transformers as well as problems caused by variations in the properties of the piezoelectric elements when they are subjected to non-isotropic hydrostatic pressures. A solution, which consists of placing the air contained in the housing cover under the same pressure as the exterior, is already known.

Aside from elementary transducers composed of a single piezoelectric motor element contained in an individual housing, there are also known multimotor transducers composed of a plurality of piezoelectric motor elements located within the same cylindrical envelope and of antennas composed of a plurality of juxtaposed multimotor transducers. The construction of these multimotor transducers and of these antennas raises problems when they must be immersed to a great depth since a large volume of air, not occupied by the motor elements, remains within the envelope. Placing the volume of air in pressure equilibrium with the outside by means of a deformable balloon is not a practical solution since it would be necessary to use deformable containers of very large volume.

An object of the present invention is to provide means which make it possible to immerse at great depth elementary transducers and antennas composed of a plurality of motor elements located in the same envelope, without detrimentally affecting the properties of the piezoelectric elements.

The invention is applicable either to elementary transducers having their own envelope or to transducers and antennas composed of a plurality of motor elements located within the same water-tight envelope. In this latter case, they apply to antennas composed of a cylindrical envelope which serves as a vibrating wall against which there are radially arranged piezoelectric motor elements which may either have no point of contact with each other or else be connected by a central countermass. The invention may also be used in the case of antennas composed of a plurality of piezoelectric motor elements which are mounted in a star shape around a common central countermass, the horns of which have the shape of cylindrical segments and are juxtaposed so that they define a cylindrical surface. In general, the present invention applies to all piezoelectric transducers and to all antennas comprising on the one hand a gas-tight envelope and on the other hand at least one piezoelectric motor element located partially within the envelope and constituting a part of the walls thereof, called the vibrating wall, which transmits the acoustic waves between the water and the piezoelectric motor elements.

SUMMARY OF THE INVENTION

The object of the invention is achieved by means of transducers or antennas which comprise, in the space contained between the motor elements and the inner wall of the envelope, a solid material which is separated from the vibrating wall or the envelope by a small clearance which is filled with gas at the same pressure as the outside.

A transducer in accordance with the invention furthermore comprises, within the envelope, at least one cylindrical channel having two open opposite ends within which a piston slides, the first of these ends communicating with the outside of the envelope. The second end is contained within the envelope and communicates with the gas-filled clearance which separates the solid material from the vibrating wall of the envelope.

In a first embodiment, the solid material is an elastomeric material which is poured into the envelope and which occupies the entire space contained between the motor elements and the channels and is separated from the vibrating wall of the envelope by a small gas-filled clearance which communicates with the volume of gas contained between the pistons and the ends of the channels located within the envelope.

In a second embodiment, the solid material is a rigid material which is separated by a very small clearance from the side walls of the piezoelectric motors and from the inner walls of the envelope. This clearance is filled with gas which communicates with the volume of gas contained between the pistons and the ends of the channels located within the envelope.

The invention has resulted in new elementary piezoelectric transducers and new antennas composed of a plurality of transducers placed within the same envelope and which can be immersed to a very great depth. It applies in particular, but not exclusively, to multimotor transducers and to antennas composed of one or more metal rings which play the role of a horn or vibrating wall, against which several piezoelectric motor elements are radially arranged.

This type of transducer and of antenna has numerous advantages from the standpoint of gain in space and of directivity. However, up to the present time the extent to which these transducers and antennas could be used was limited by the fact that the volume of air contained within the envelope is substantial and it was not possible to maintain it in equilibrium pressure without using a large volume of reserve air, which took up too much space. If the envelope is filled with a liquid and maintained at equal pressure with the outside, the liquid transmits both the hydrostatic pressures and the acoustic pressures. In this case, the acoustic pressures act on the inner faces of the horns or on the inner face of the rings bearing the piezoelectric motor elements which serve as horns and the operation of the transducers is disturbed.

The solution in accordance with the present invention, in which the inner space of the envelope is filled with a solid material which is separated from the inner wall of the envelope by a small gas-filled clearance which communicates with the volume of compressed gas in each cylindrical channel, makes it possible acoustically to uncouple the inner face of the horns while retaining a very small amount of gas within the envelope. This makes it possible to maintain the latter under equal pressure using a relatively small reserve volume of gas so that the volume of one or more wells housed within the envelope is sufficient. Thus, the total space taken up by the transducer or antennas is not increased and furthermore placing the device under equilibrium pressure can be easily accomplished by means of pistons which slide within cylinders. This constitutes a more satisfactory solution than bag-shaped or balloon-shaped deformable envelopes, which are always fragile.

BRIEF DESCRIPTION OF THE DRAWINGS

The following description refers to the accompanying drawings which show various embodiments of acoustic antennas in accordance with the invention.

DESCRIPTION OF THE PREFERRED EMBODIMENTS

Figure 2:
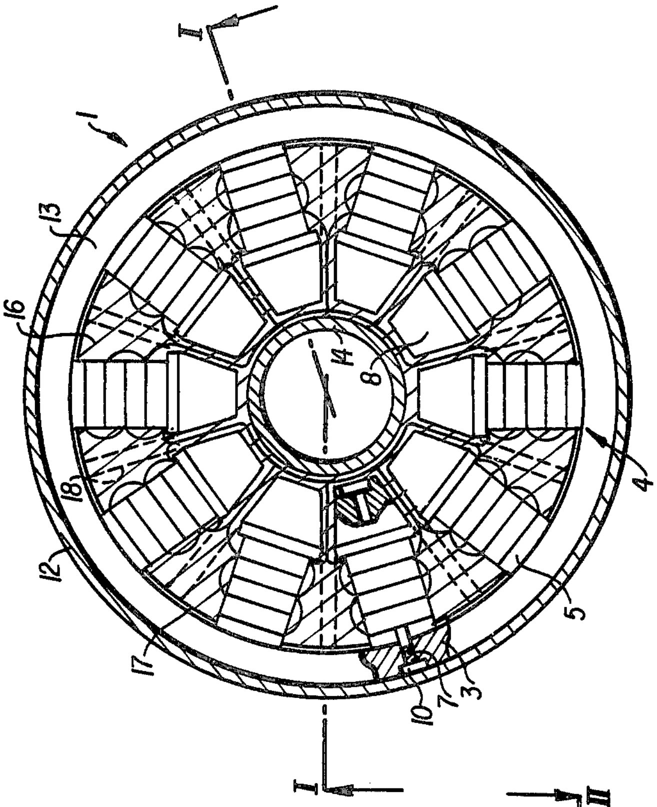
FIGS. 1 and 2 show an axial section and a cross section respectively through a first embodiment of an antenna in accordance with the invention.
Figure 1:
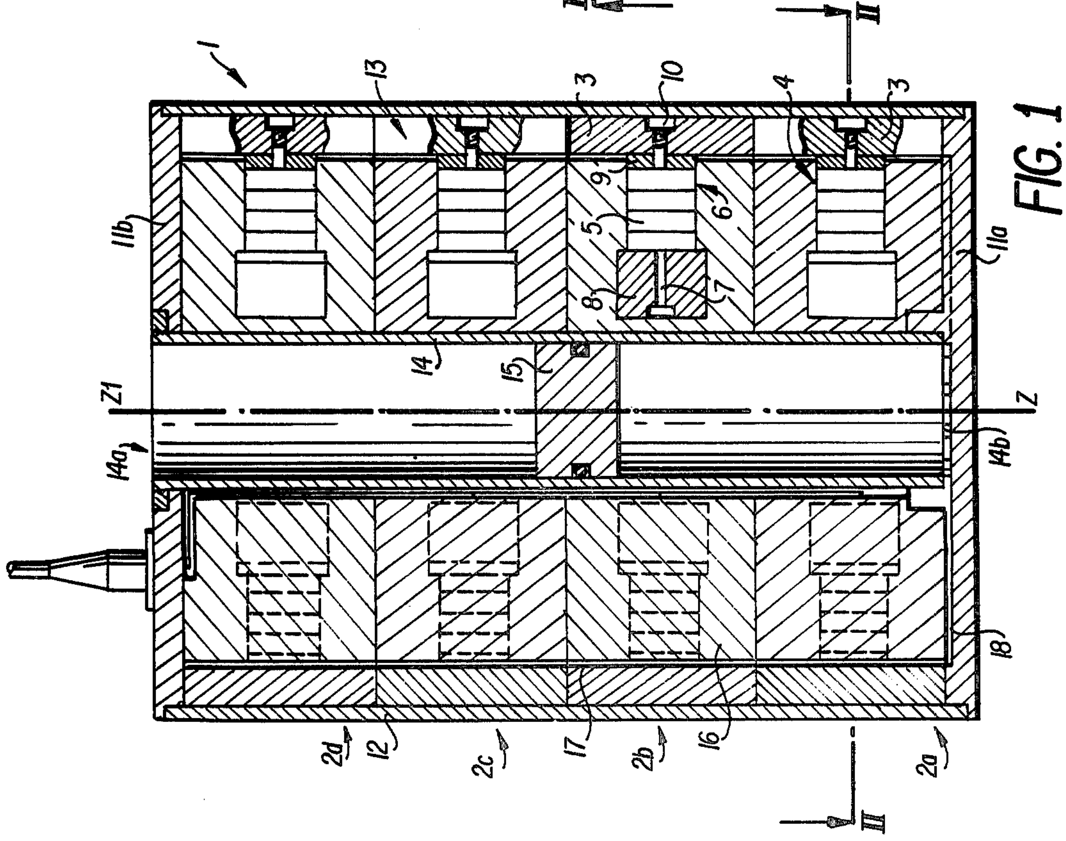

FIGS. 1 and 2 show an acoustic antenna 1 having a vertical axis Z-Z1. This antenna is composed of four idential unit transducers **2*a*, 2*b*, 2*c* and 2*d* which are superposed co-axially. Each unit transducer is composed in known manner of a metal ring 3, on the inner wall of which there are radially fastened several piezoelectric motor elements 4** located in the same plane perpendicular to the axis Z-Z1.

For example, in the embodiment of FIGS. 1 and 2, each unit transducer comprises ten piezoelectric motor elements. Each motor element comprises a stack of piezoelectric elements 5 alternating with electrodes 6 which are held compressed by a prestressing rod 7 between a rear mass or countermass 8 and a support piece 9. A nut 10, contained within a recess in the ring 3, is screwed onto the threaded end of the prestressing rod and thus makes it possible to compress the piezoelectric elements and fasten the motor element to the ring 3.

The stacked rings 3 form a cylindrical envelope 13 having an axis Z-Z1 which is closed hermetically at each end by covers **11*a* and 11*b*. A diaphragm 12**, of a material which is transparent to the acoustic waves, surrounds the antenna. Such an antenna is already known and it is not necessary to describe it in further detail.

It is sufficient to state that when all of the piezoelectric motor elements are excited, the rings 3 are caused to vibrate and behave like a horn which gives off acoustic waves into the ambient medium. If all of the motor elements are excited in phase, there is obtained a smaller antenna which is prefectly omnidirectional. A directional antenna can also be obtained by exciting only some columns of motor elements. Antennas of this type may be transmitting or receiving antennas.

An antenna in accordance with the invention comprises an axial cylindrical channel 14, one end **14*a* of which passes through the cover 11*b* and is open to the outside. The cylinder 14 contains a piston 15 which slides along the cylinder. The face of this piston which is directed towards the end 14*a*, is subjected to the hydrostatic pressure when the enclosure is immersed and a volume of gas contained between the piston 15 and the end 14*b*** is at the same pressure as the outside.

Within the envelope 13, the entire space outside the channel 14 and located between the motor elements 4 is filled with a relatively non-compressible elastomeric solid 16, for instance a silicone resin or a polyurethane resin, which transmits the pressure. This filling 16 fully covers the outer wall of the tube 14 and the side walls of the motor elements 4, as well as the countermasses 8. On the other hand, it is separated from the inner wall of the rings 3 by a slight clearance 17, which is filled with an inert gas. This clearance 17 communicates, via channels 18, with the end **14*b* so that the gas contained within the space 17** is at the same pressure as the outside.

This gas-filled space acoustically decouples the inner face of the rings 3, and the two faces of envelope 13 are not subjected to any difference in pressure so that the antenna can be immersed to a great depth.

The layer of gas 17 is very thin, of the order of a tenth of a millimeter, so that the total volume of air of this layer is less than the volume of the cylinder 14 and the antenna can be immersed to a very great depth. The depth of immersion can be increased by initially filling the cylinder 14 and the space 17 with a compressed gas, under a pressure which the envelope can readily withstand. A thin layer 17 is easily obtained by placing a covering of foil against the inner walls of the envelope before the pouring in of the elastomeric material 16, and then removing the foil.

The pressure of the layer 17 is balanced by the elastic forces of compression which are developed in the material 16. The latter compresses the side walls of the motor elements but this compression is isotropic and does not disturb their operation.

Figure 4:
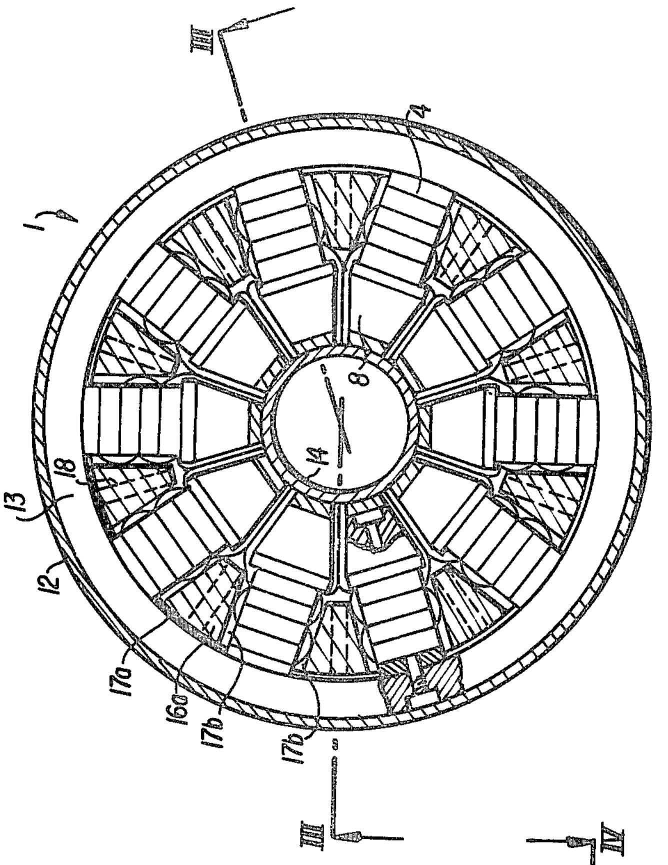
FIGS. 3 and 4 show an axial section and a cross section respectively through a second embodiment of the invention.
Figure 3:
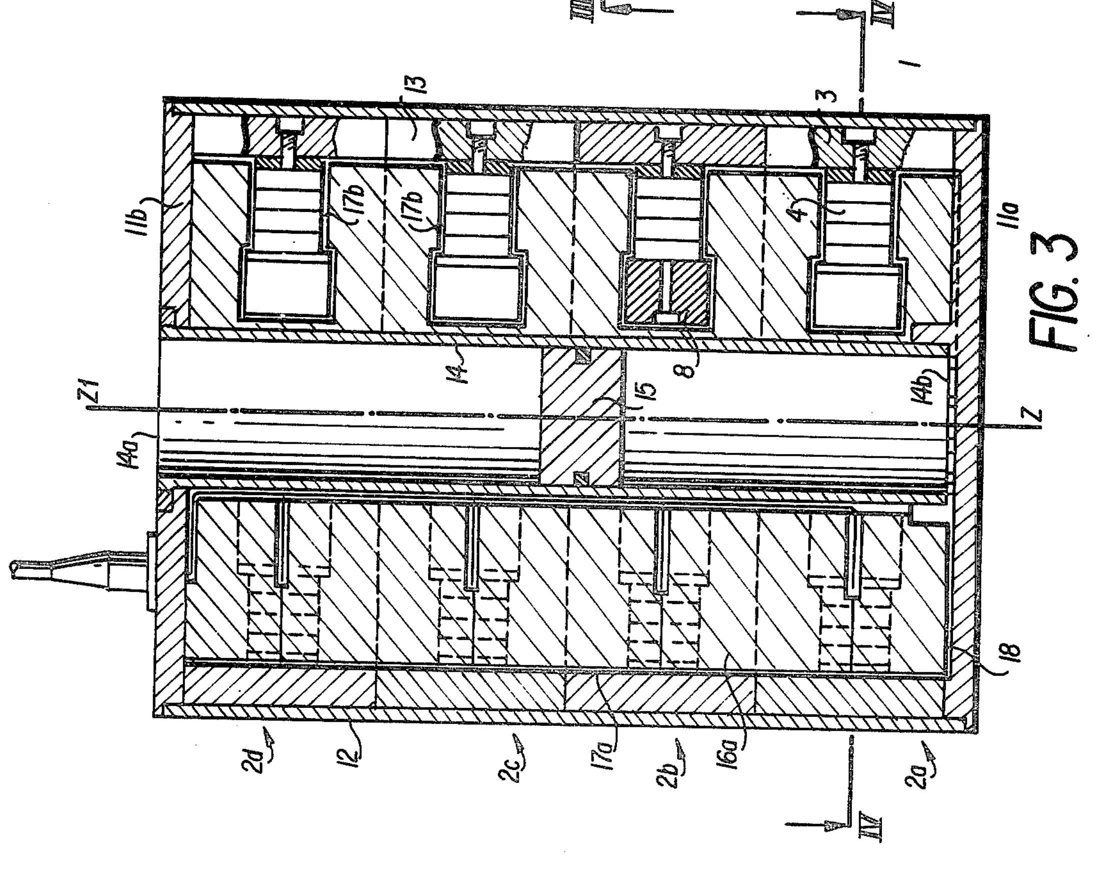

FIGS. 3 and 4 depict a variant of the antenna shown in FIGS. 1 and 2. The known parts of the antenna are identical and bear the same reference numbers. This embodiment differs from the preceding one by the fact that the filling **16*a*** is formed of a rigid solid, for instance a rigid polymerizable resin.

In this case, the filling **16*a* is separated not only from the inner wall of the rings 3 by a thin gas-filled clearance 17*a* but also from the side walls of the motor elements 4 and from the countermasses 8 by a thin space 17*b*, which is also filled with gas. The spaces 17*a* and 17*b* communicate via channels 18 with the end 14*b* of the cylinder 14**.

FIGS. 1 to 4 show ring transducers composed of motor elements whose countermasses have no point of contact with each other and, in this case, a cylinder 14 can be provided along the axis. There are also known ring transducers in which the motor elements have a common central countermass. In this case, several cylinders of small diameter can be arranged parallel to the axis in the spaces between motor elements and each of these cylinders is equipped with a piston.

Figure 6:
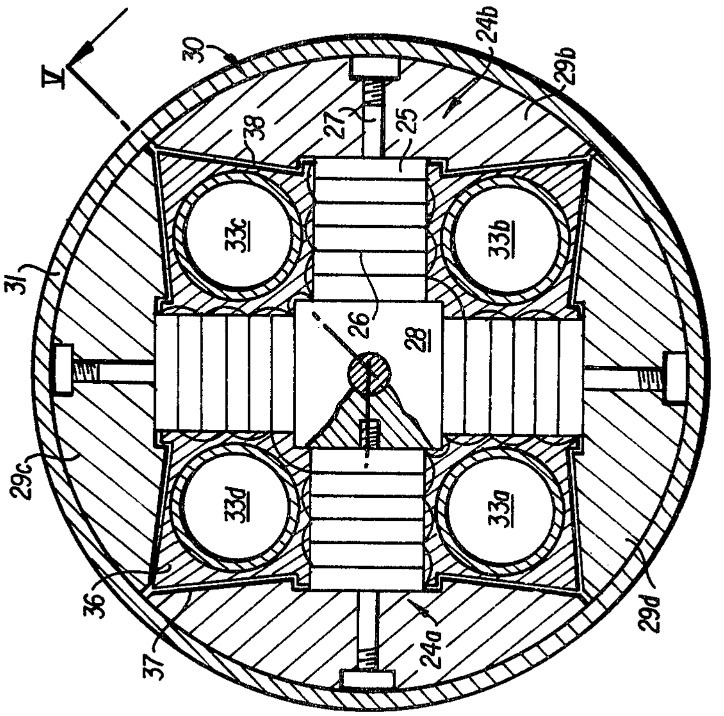
FIGS. 5 and 6 show an axial section and a cross section respectively through a third embodiment.
Figure 5:
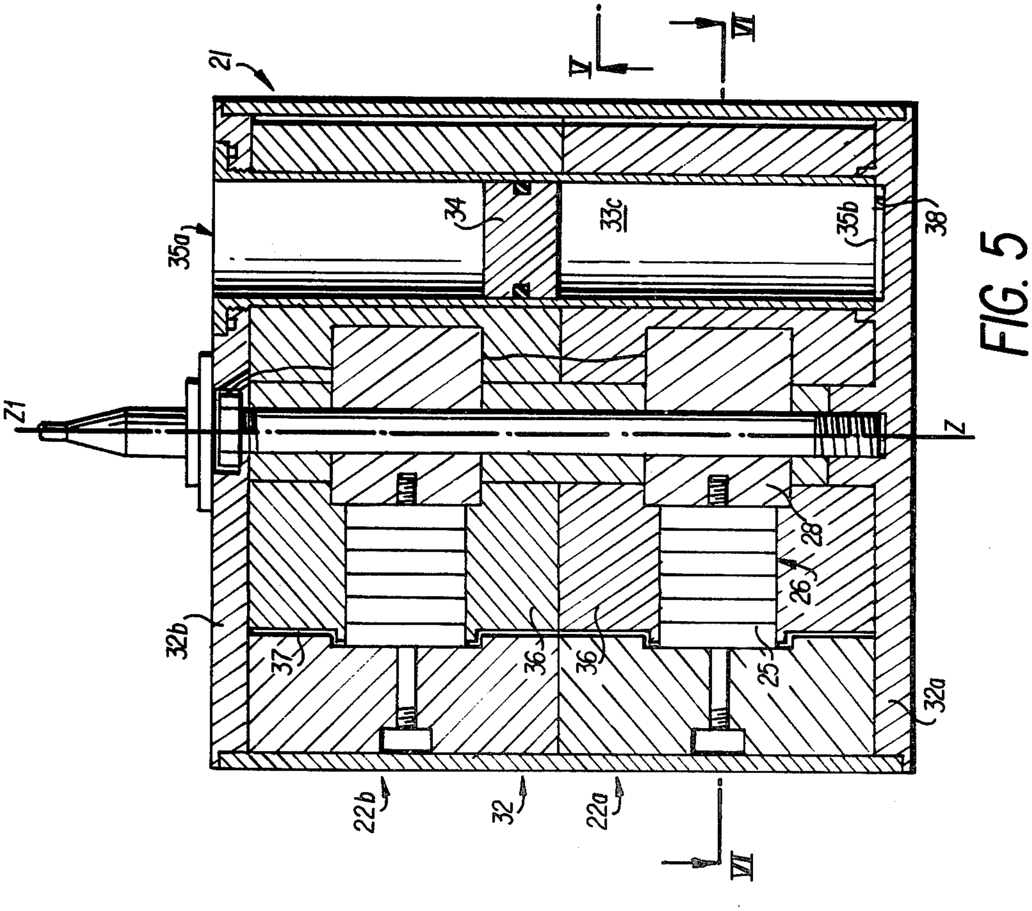

FIGS. 5, 6, 7 and 8 show another type of acoustic antenna 21. The antenna shown in FIGS. 5 and 6 is composed, for instance, of two identical elements **22*a* and 22*b***, which are juxtaposed coaxially. The number of elements may be greater than two or may be reduced to only one.

Each element is composed of two perpendicular pairs of piezoelectric motor elements. Each pair comprises two diametrically opposite motor elements, for instance the motor elements **24*a* and 24*b* mounted in opposition. Each piezoelectric motor element is composed of a member consisting of a stack of piezoelectric plates 25** alternating with electrodes 26. The stack is held in compression by a prestressing rod 27 between a central countermass 28, which is common to the four transducers located in the same plane perpendicular to the axis Z-Z1, and horns *29a* and *29b*. Multi-motor transducers and acoustic antennae having this structure are already known.

In accordance with the invention, the horns *29a*, *29b*, *29c* and *29d* have the shape of cylindrical segments which are bounded on the outside by a quarter of a cylinder, the generatrices of which are parallel to the axis Z-Z1. They are bound on the inside by substantially flat rear faces.

The four horns of the two pairs of motor elements of the same antenna element are juxtaposed so that the outer faces of these four horns are inscribed on the same cylinderical surfaces 30, having the axis Z-Z1, as shown in FIG. 6. This cylindrical surface is surrounded by a flexible diaphragm 31 which is transparent to acoustic waves. The horns surrounded by the diaphragm 31 form an envelope 32 which is hermetically closed at its two ends by two covers *32a* and *32b*. Within this envelope 32, in the intermediate spaces between the transducers 24, there are located cylindrical wells parallel to the axis Z-Z1, for instance four wells *33a*, *33b*, *33c*, *33d*. Each of these wells contains a piston 34 and has a first end *35a* which communicates with the outside and a second end *35b* which is located within the envelope 32 so that when the antenna is immersed the volume of gas located between the piston and the end *35b* is maintained in equilibrium pressure with the outside by the hydrostatic pressure which acts on the upper face of the piston.

As in the case of the antennas of FIGS. 1 to 4, within the envelope 32, the space contained between the transducers 24 and outside the wells 33 is filled by a solid material 36. In the case of FIGS. 5 and 6, the filling 36 is formed of an elastomeric material, which is separated from the inner face of the horns by a very small clearance 37, which is filled with gas. This clearance 37, which forms a continuous space, is placed in communication by channels 38 with the ends *35b* of the wells 33.

The clearance 37 provides an acoustic decoupling between the inner face of the horns and the inside of the envelope.

Figure 8:
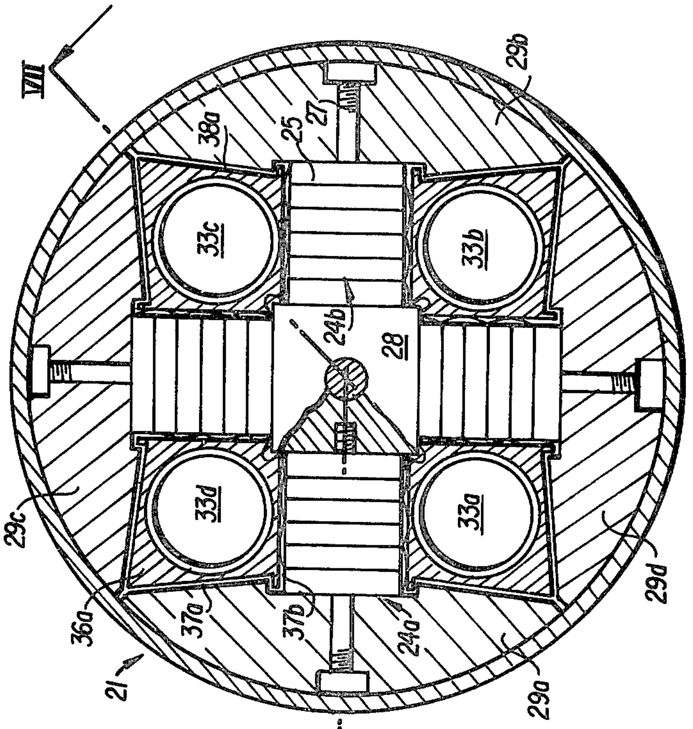
FIGS. 7 and 8 are an axial section and a cross section respectively through a fourth embodiment.
Figure 7:
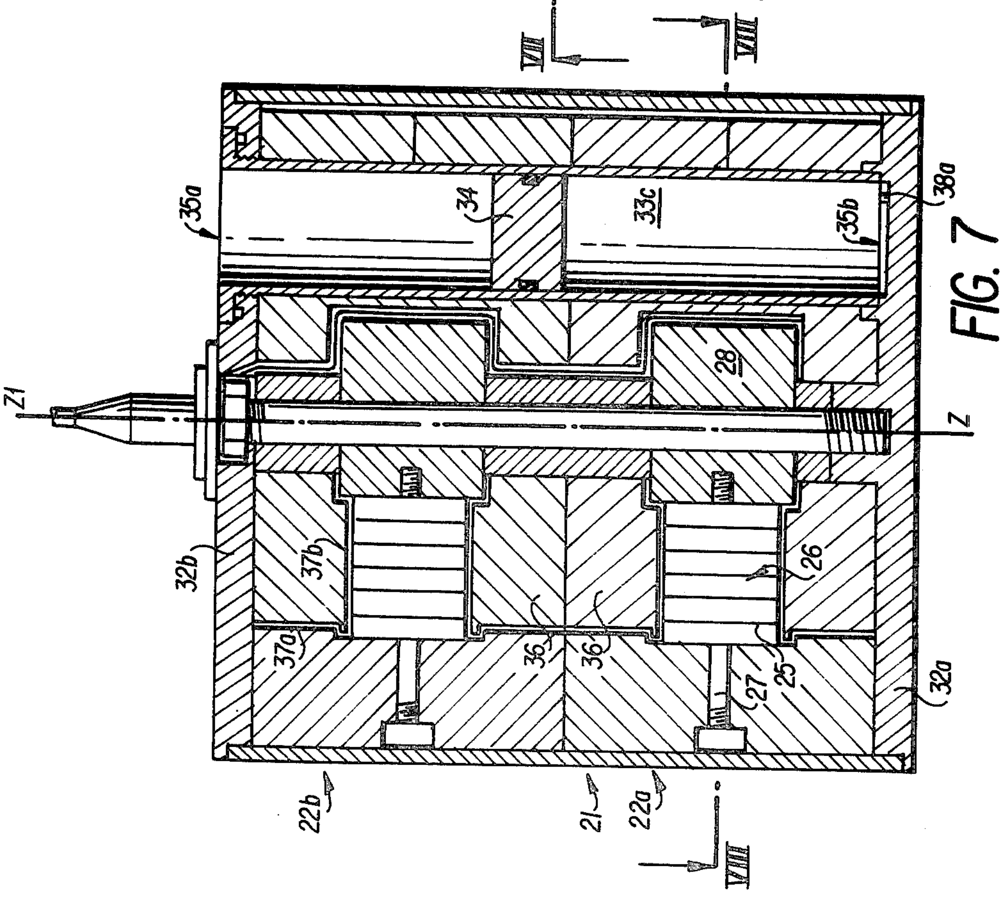

In the embodiment shown in FIGS. 7 and 8, the filling *36a* is formed of a rigid material. In this case, the filling *36a* is separated not only from the inner face of the horns by a slight clearance *37a* but also from the side faces of the motor elements by a slight clearance *37b*. This construction provides total acoustic decoupling between the motors and the filling *36a*. Channels *38a* place the ends *35b* of the wells 33 in communication with the clearances *37a* and *37b*.

The above examples relate to antennas having a large number of motor elements in the same large-volume envelope, this being an application which is of particular interest, but it is not limitative of the invention.

Figure 9:
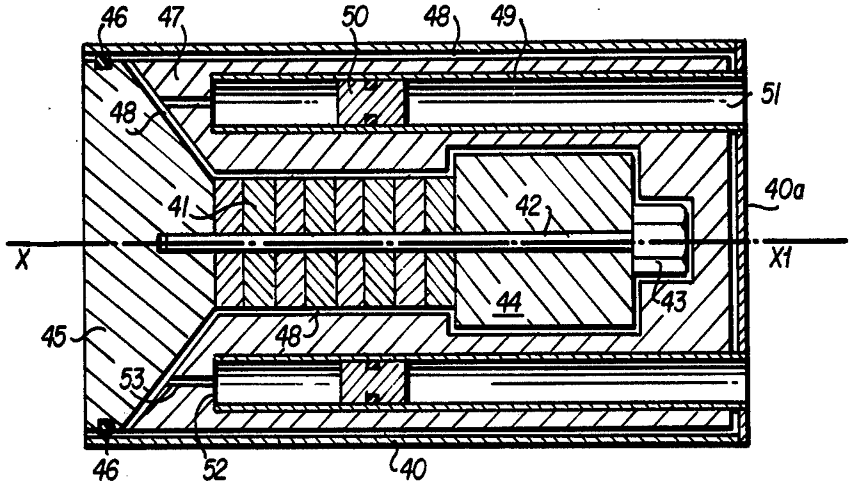
FIG. 9 is an axial section through a unit transducer.

FIG. 9, on the other hand, shows an axial section through a unit transducer of the Tonpilz type. This transducer is composed of a cylindrical housing 40, having the axis X-X1, one end of which is closed by a cover *40a*. This housing contains a single piezoelectric motor element composed of a stack of piezoelectric elements 41 alternating with electrodes, which are compressed by means of a prestressing rod 42 and a nut 43 which is screwed on the latter between a countermass 44 and a frustoconical horn 45. The horn 45 has a lateral groove in which there is housed a toroidal gasket 46 which rests against the side wall of the housing 40, so that the horn can vibrate independently of the housing. The horn hermetically closes-off one end of the housing 40 and, together with it and the cover *40a* forms a hermetic envelope containing the piezoelectric motor element. Such a transducer is well known.

In accordance with the invention, the space between the motor element and the inner wall is filled with a solid material 47. FIG. 9 corresponds to the case in which this material is rigid. In this case, it is separated from the rear face of the horn, the side faces of the motor element, and the countermass and inner walls of the envelope by a small gas-filled clearance 48.

In the solid material 47 there are embedded tubes 49, in each of which a piston 50 slides. One end 51 of these tubes passes through the cover *40a* and communicates with the outside of the envelope. The other end 52 is located on the inside of the envelope, behind the horn 45, and it communicates with the clearance 48 via a small channel 53 or any other equivalent means.

As a variant, the rigid material 47 may be replaced by an elastomeric or visco-elastic material. In this case the entire space contained between the motor element 41, 44, the tubes 49, and the inner wall of the envelope is filled by this material, with the exception of a clearance 48 which separates it from the rear face of the horn, which is the vibrating wall of the envelope.

What is claimed is:

1. In a piezoelectric transformer for immersion in a medium including a countermass; a plurality of piezoelectric motor elements mounted radially around said countermass, each of said motor elements having a piezoelectric member and a horn in the shape of a cylindrical segment, said motor elements being positioned so that the outer faces of said horns form a closed cylindrical surface; a deformable acoustically transparent cylindrical diaphragm surrounding the outer cylindrical faces of said horns; and first and second end covers covering the ends of said cylindrical diaphragm, the improvement comprising:

a solid material having a plurality of cylindrical wells therein interposed between said horns and separated from said horns by a clearance space, and a plurality of pistons each located in a respective one of said cylindrical wells, each of said pistons separating the well within which it is located into a first portion communicating through an opening in said first cover with the medium outside of said envelope and a second portion communicating with the clearance space between said solid material and said horns, said clearance space and the second portions of said cylindrical wells being filled with a gas.

2. A piezoelectric transformer as defined by claim 1 wherein said solid material is an elastomeric material.

3. A piezoelectric transformer as defined by claim 1 wherein said solid material is a rigid material and wherein said solid material is separated from said horns and said piezoelectric member by a small clearance space.

4. A piezoelectric transducer for immersion in a medium comprising:

a cylindrical housing having a longitudinal axis, a cover closing one end of said housing, a piezoelectric motor element located within said housing, said piezoelectric motor element including a stack of alternating piezoelectric elements and electrodes, a countermass secured to one end of said stack, a frustoconical horn hermetically closing off the other end of said housing to form with said housing and said cover a hermetically sealed enclosure, a solid material having a plurality of hollow tubes embedded therein substantially filling the space between the inner wall of said housing and said piezoelectric motor element, said solid material being separated from said piezoelectric motor element, said horn, said countermass and the inner walls of said envelope by a gas-filled clearance space, and a plurality of pistons slidably mounted within corresponding hollow tubes thereby separating each of said tubes into first and second portions, the first portions of said tubes communicating with the medium outside of said piezoelectric transducer and the second portions of said tubes communicating with said clearance space.

5. The piezoelectric transducer defined by claim 4 wherein said solid material is rigid.

6. In a piezoelectric transducer, for immersion in a medium, including a gas tight envelope having an inner vibratory wall and at least one piezoelectric motor element located within said envelope, the improvement comprising:

an elastomeric material situated within the space between said motor element and the inner wall of said envelope, and a plurality of cylindrical channels in said envelope having first and second opposite end portions and a piston slidable within each channel separating said first and second portions, the first end portion of said channel communicating with the medium surrounding said piezoelectric transducer and the second end portion being contained within said envelope, the space within said envelope and outside said channels and said piezoelectric motor elements containing said elastomeric material being separated from the inner vibratory wall of said envelope by a clearance space communicating with the volume of gas contained between said pistons and the second end portions of said tubes whereby the gas in said clearance space is at the same pressure as that of the medium surrounding said envelope.

7. In a piezoelectric transducer, for immersion in a medium, including a gas tight envelope having an inner vibratory wall and at least one piezoelectric motor element located within said envelope, the improvement comprising:

a rigid material situated within the space between said motor element and the inner wall of said envelope, and a plurality of cylindrical channels in said envelope having first and second opposite end portions and a piston slidable within each channel separating said first and second portions, the first end portion of said channel communicating with the medium surrounding said piezoelectric transducer and the second end portion being contained within said envelope, the space within said envelope and outside said channels and said piezoelectric motor elements containing said rigid material being separated from the side walls of said motors and from the inner vibratory wall of said envelope by a clearance space communicating with the volume of gas contained between said pistons and the second end portions of said tubes whereby the gas in said clearance space is at the same pressure as that of the medium surrounding said envelope.

8. The piezoelectric transducer defined in claim 7 wherein said rigid material is a rigid polymerizable resin.

* * * * *